(12) United States Patent
Masaki

(10) Patent No.: US 12,507,498 B2
(45) Date of Patent: Dec. 23, 2025

(54) PHOTOSENSOR

(71) Applicant: ROHM CO., LTD., Kyoto (JP)

(72) Inventor: Takaaki Masaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 531 days.

(21) Appl. No.: 18/052,473

(22) Filed: Nov. 3, 2022

(65) Prior Publication Data

US 2023/0187571 A1 Jun. 15, 2023

(30) Foreign Application Priority Data

Dec. 9, 2021 (JP) ................. 2021-200226

(51) Int. Cl.
*H10F 55/10* (2025.01)
*H01S 5/042* (2006.01)
*H01S 5/183* (2006.01)
*H10F 77/50* (2025.01)

(52) U.S. Cl.
CPC ......... *H10F 55/17* (2025.01); *H01S 5/04256* (2019.08); *H10F 77/50* (2025.01); *H01S 5/183* (2013.01)

(58) Field of Classification Search
CPC ..... H10F 77/50; H10F 55/10–17; H01S 5/183
See application file for complete search history.

(56) References Cited

U.S. PATENT DOCUMENTS 10,475,937 B1 * 11/2019 Jones .................... H10F 30/289
10,950,743 B2 * 3/2021 Gopal Krishnan ... G01S 7/4813
2014/0191253 A1 * 7/2014 Haslbeck ............... H01L 25/167 438/26
2015/0226839 A1 * 8/2015 Brandl .................... H10F 77/40 250/221
2018/0114875 A1 * 4/2018 Ho ......................... H10F 55/255
2019/0035966 A1 * 1/2019 Hsiao ...................... H10F 55/00
2019/0081097 A1 * 3/2019 Shen ....................... G06F 21/32
2022/0140174 A1 * 5/2022 Tanaka ................... H10F 77/953 257/82
2022/0375912 A1 * 11/2022 Templier ............. H01L 25/0753
2023/0012665 A1 * 1/2023 Miura ................... H10F 55/165

FOREIGN PATENT DOCUMENTS

JP 2017011120 A 1/2017
TW M363080 U * 8/2009

* cited by examiner

*Primary Examiner* — Evren Seven
(74) *Attorney, Agent, or Firm* — HSML P.C.

(57) ABSTRACT

A photosensor including first and second conductive layers disposed on a main surface and a back surface of a substrate is provided. A conductive via layer is disposed between the conductive layers. A light emitting element and an integrated circuit (IC) including a light receiving element are mounted on the first conductive layer. The photosensor includes a translucent covering member that covers the light emitting element and the IC together with the first conductive layer. The covering member includes a groove between the light emitting element and the IC in a plan view. The first conductive layer includes a first mounting portion on which the light emitting element is mounted and a second mounting portion on which the IC is mounted. The light emitting device is electrically connected to the IC via the first mounting portion, the conductive via layer, the second conductive layer and the second mounting portion.

16 Claims, 6 Drawing Sheets

PHOTOSENSOR

TECHNICAL FIELD

The present disclosure relates to a photosensor.

BACKGROUND

A reflective type photosensor (a so-called "proximity sensor") detects the presence of an object in a non-contact manner. The reflective type photosensor detects the presence of an object under detection by means of detecting a reflected light using a light receiving element after the object reflects a light emitted from a light emitting element. In such a photosensor, optical crosstalk (hereinafter simply referred to as crosstalk) caused by diffused light from the light emitting element reduces the detection accuracy of the light receiving element with respect to the object. Patent publication 1 discloses a proximity sensor having a package structure for reducing crosstalk as an example of a photosensor.

PRIOR ART DOCUMENT

Patent Publication

[Patent publication 1] Japan Patent Publication No. 2017-11120

SUMMARY

Problems to be Solved by the Disclosure

In the recent years, miniaturization and high-functionality of photosensors continue to develop, and while also seeking for reducing crosstalk, there is also a need to integrate other various elements or circuits with a light emitting element and a light receiving element in one single package.

Technical Means for Solving the Problem

A photosensor according to an aspect of the present disclosure includes: a substrate; a first conductive layer, disposed on a main surface of the substrate; a second conductive layer, disposed on a back surface of the substrate; a conductive via layer, disposed between the first conductive layer and the second conductive layer; a light emitting element, mounted on the first conductive layer; an integrated circuit, mounted on the first conductive layer and including a light receiving element; and a covering member being translucent, disposed on the substrate, covering the light emitting element and the integrated circuit together with the first conductive layer, and including a groove between the light emitting element and the integrated circuit in a plan view of the substrate. The first conductive layer includes: a first mounting portion, on which the light emitting element is mounted; and a second mounting portion, on which the integrated circuit is mounted. The light emitting element is electrically connected to the integrated circuit through the first mounting portion, the conductive via layer, the second conductive layer and the second mounting portion.

Effects of the Disclosure

A photosensor according to an aspect is capable of achieving both miniaturization and high-functionality while reducing crosstalk.

DETAILED DESCRIPTION

Figure 1:
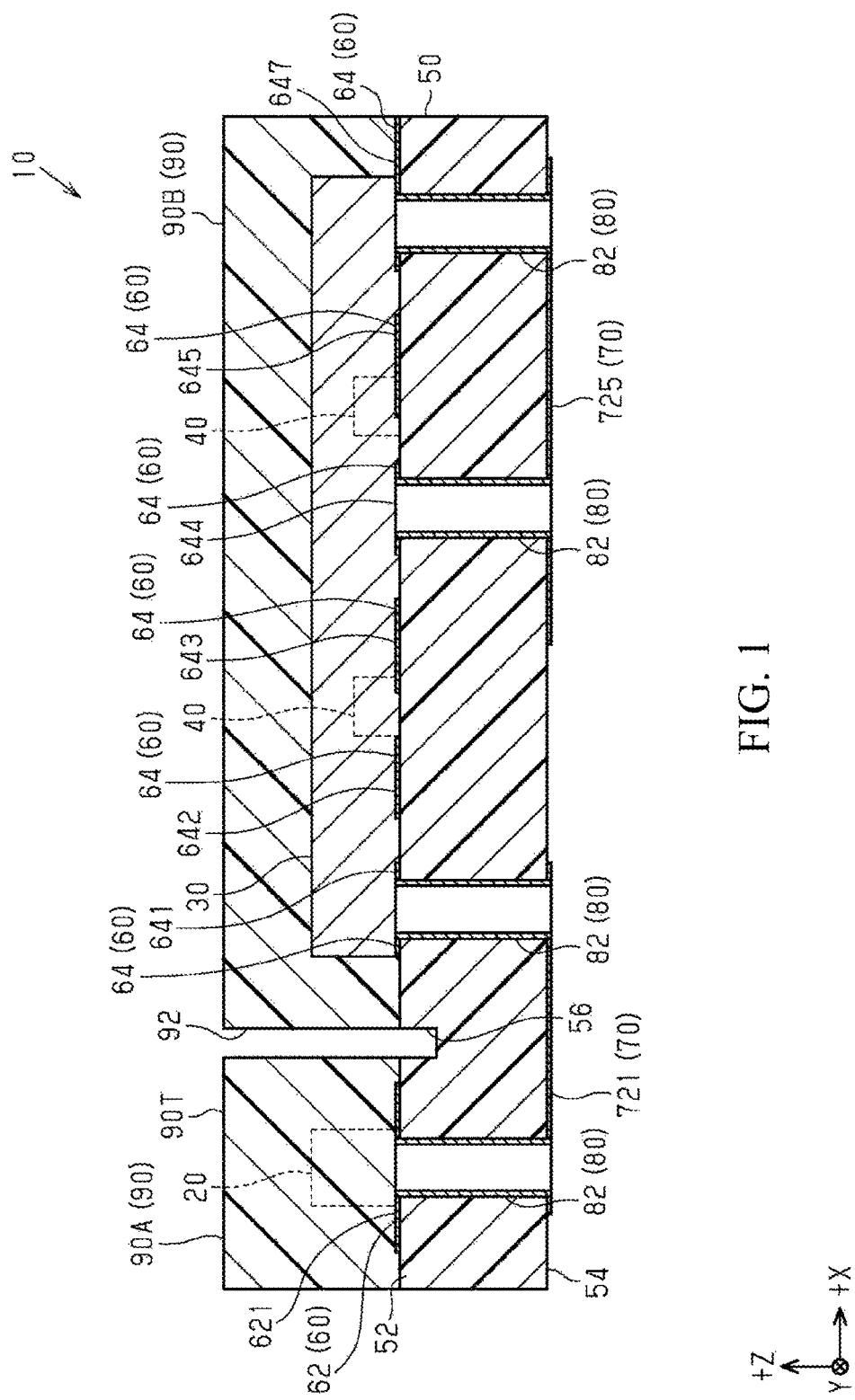
FIG. 1 is a brief cross-sectional diagram (a cross-sectional diagram taken along the line F1-F1 in FIG. 2) of an example of a photosensor according to an embodiment.

Details of the embodiments of the present disclosure with respect to a semiconductor light emitting device are given with the accompanying drawings below.

To keep the description clear and simple, the constituting elements shown in the drawings are not necessarily drawn to fixed scales. Moreover, for better understanding, section lines are sometimes omitted from the cross-sectional diagrams. It should be noted that the drawings are for illustrative examples of the embodiments of the present disclosure, and are not to be construed as limitations to the present disclosure.

The description below includes details for implementing a device, a system and a method of the illustrative embodiments of the present disclosure. The detailed description should be used for illustration purposes and is not to be construed as limitations to the embodiments of the present disclosure or applications and uses of these embodiments.

Brief structure of Photosensor

FIG. 1 shows a brief cross-sectional diagram of an example of a photosensor 10 according to an embodiment. The photosensor 10 includes a light emitting element 20 and an integrated circuit (IC) 30. The integrated circuit 30 includes one or more (for example, two) light receiving elements 40. The photosensor 10 is, for example, implemented as a reflective type photoelectric sensor. The reflective type photoelectric sensor may also be referred to as a light reflector. The integrated circuit 30 including the light receiving element 40 is also referred to as an optical integrated circuit. The light emitting element 20 is implemented by, for example, a semiconductor laser component such as a vertical cavity surface emitting laser (VCSEL). The light receiving element 40 may be implemented by a photodiode (PD), for example.

As shown in FIG. 1, the photosensor 10 includes a substrate 50, a plurality of (for example, two in FIG. 1) conductive layers 60 and 70, and a conductive via layer 80 disposed between the conductive layers 60 and 70. The conductive layers 60 and 70 are disposed at different layer positions from each other. In the example in FIG. 1, the conductive layer 60 corresponds to a first conductive layer, and the conductive layer 70 corresponds to a second conductive layer. In the description below, for differentiation of terms and better understanding, the conductive layers 60 and 70 are sometimes referred to as a first conductive layer 60 and a second conductive layer 70.

The substrate 50 is formed of, for example, an insulative material such as a resin substrate or a ceramic substrate. The resin substrate is, for example, glass epoxy. The ceramic material is, for example, aluminum nitride (AlN) and aluminum oxide ($Al_2O_3$). Alternatively, the substrate 50 may also be formed of, for example, other insulative materials such as a silicon substrate or a glass substrate. The substrate 50 includes a main surface 52 and a back surface 54 on an opposite side.

Moreover, the term "plan view" used in the present disclosure refers that the photosensor 10 (or other components) is observed in a Z direction where X, Y and Z axes (for example, refer to FIG. 1) are orthogonal to one another. The Z axis corresponds to a direction orthogonal to the main surface 52 (and the back surface 54) of the substrate 50. For better understanding of the description below, the +Z direction is defined as the top, the −Z direction is defined as the bottom, the +X direction is defined as the right, and the −X direction is defined as the left. Moreover, unless otherwise specified, the term "plan view" refers to observing the photosensor 10 in the direction of the Z axis.

The conductive layers 60 and 70 and the conductive via layer 80 are formed by metal materials such as copper (Cu) or aluminum (Al). However, other metal materials other than Cu and Al may also be used. In the example in FIG. 1, the first conductive layer 60 is disposed on the main surface 52 of the substrate 50, and the second conductive layer 70 is disposed on the back surface 54 of the substrate 50. The light emitting element 20 and the integrated circuit 30 (the light receiving element 40) are mounted on the first conductive layer 60.

The conductive via layer 80 includes a plurality of via conductors 82 for electrically connecting the first conductive layer 60 to the second conductive layer 70. In the example in FIG. 1, the via conductors 82 are disposed inside the substrate 50, and penetrate through the substrate 50 from the main surface 52 to the back surface 54. The via conductor 82 is a so-called "thermal via", and not only serves as a conductive path between the first conductive layer 60 and the second conductive layer 70, but also functions as a heat dissipation path from the first conductive layer 60 to the second conductive layer 70. Moreover, in the example in FIG. 1, the via conductor 82 is a hollow cylindrical conductor, or may be a non-hollow cylindrical conductor. Alternatively, another material having a higher thermal conductivity may also be filled inside each of the via conductors 82. In a mounting example, the conductive via layer 80 includes, for example, nine via conductors 821, 822, 823, 824, 825, 826, 827, 828 and 829 (referring to FIG. 2) as the plurality of via conductors 82.

The photosensor 10 further includes a covering member 90, which is translucent and disposed on the substrate 50, and covers the light emitting element 20 and the integrated circuit 30 together with the first conductive layer 60. The covering member 90 is formed of, for example, a transparent resin material such as a silicone resin. The type of the resin material is not specifically defined, given that the covering member 90 is translucent. In addition to the function of protecting the light emitting element 20 and the integrated circuit 30, the covering member 90 further provides a function of enhancing light extraction efficiency of light from a light emitting surface 90T (an upper surface of the covering member 90 in FIG. 1) of the photosensor 10, by diffusing light emitted from the light emitting element 20 inside the covering member 90.

Configuration Examples of Substrate and Conductive Layers

Figure 2:
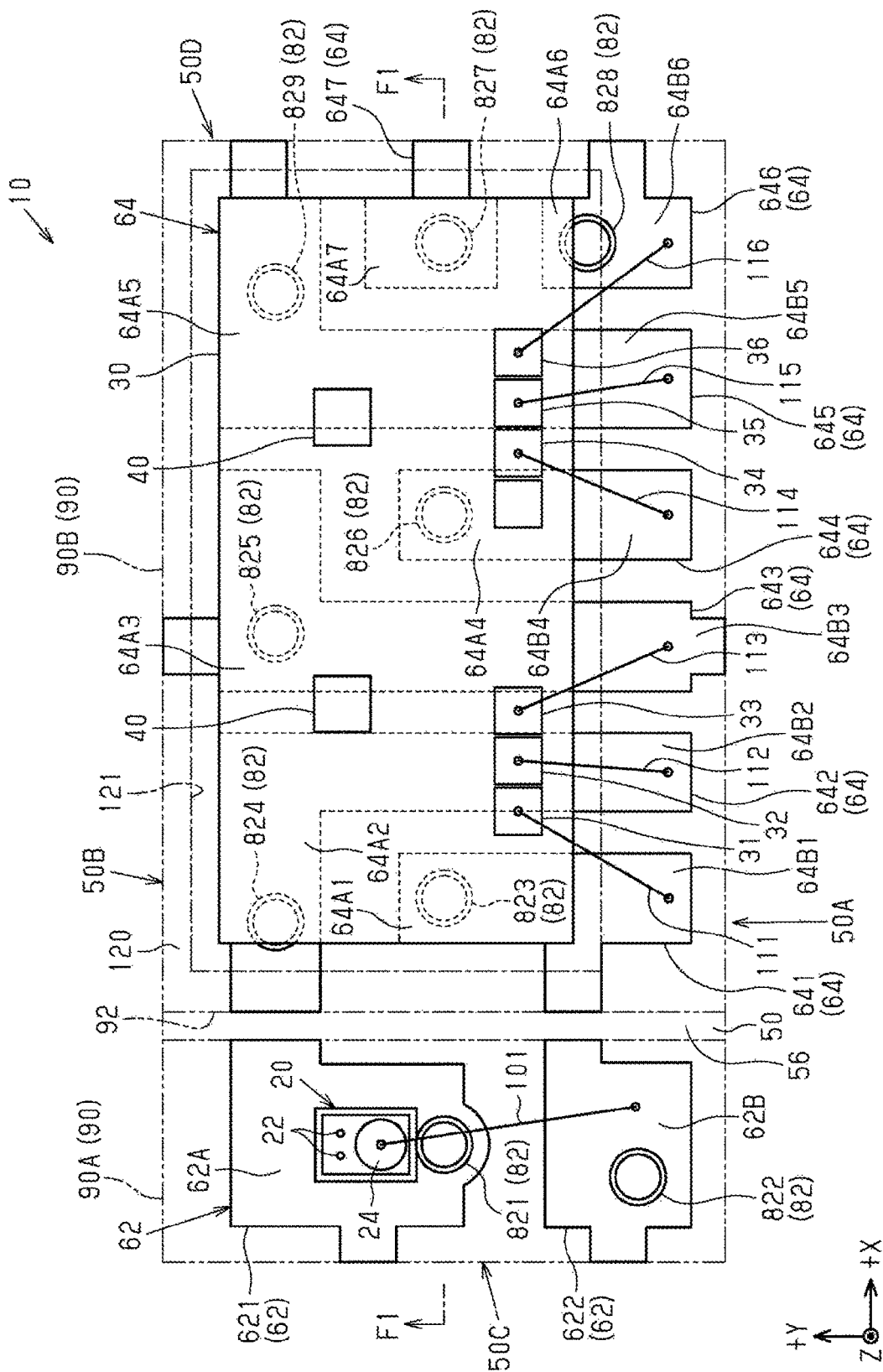
FIG. 2 is a brief plan view of a main surface-side structure of a substrate of the photosensor in FIG. 1.
Figure 3:
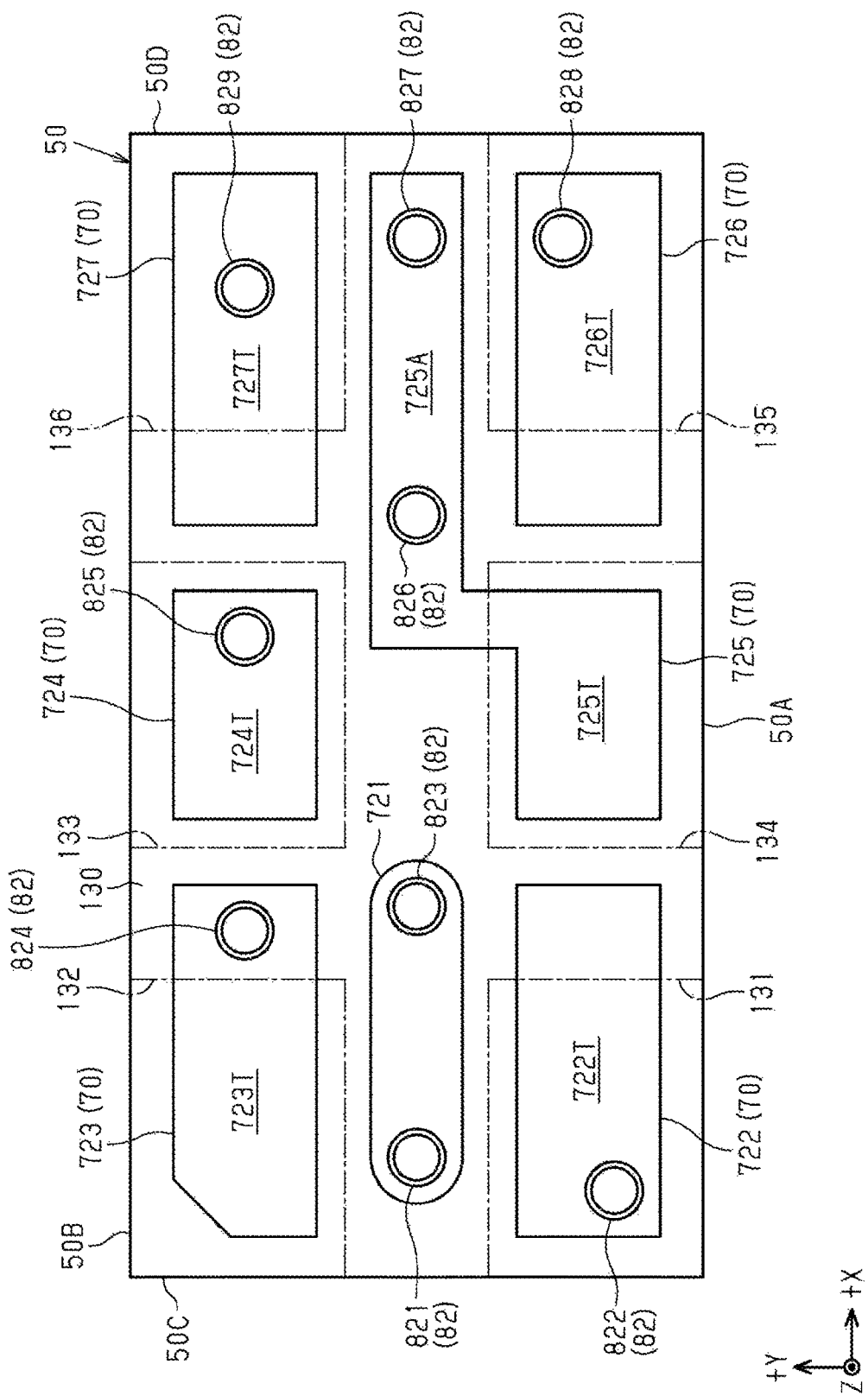
FIG. 3 is a brief plan view (a perspective diagram) of a back surface-side structure of a substrate of the photosensor in FIG. 1.

FIG. 2 shows a brief plan view of the photosensor 10 disposed on an example of the structure of the main surface 52 of the substrate 50. Moreover, FIG. 3 shows a brief plan view (a perspective diagram) of the photosensor 10 disposed on an example of the structure of the back surface 54 of the substrate 50. FIG. 1 is a cross-sectional diagram taken along a line F1-F1 in FIG. 2. In FIG. 2, for better understanding, the covering member 90 is indicated by double-dotted lines.

The substrate 50 has, for example, a rectangular shape in the plan view. However, the shape and size of the substrate 50 in the plan view are not specifically defined. In the examples in FIG. 2 and FIG. 3, in the plan view, the substrate 50 has a first side 50A and a second side 50B which are respectively long sides, and a third side 50C and a fourth side 50D which are respectively short sides. In one example, the length of the long sides (the first and second sides 50A and 50B) is approximately 2.0 mm, and the length of the short sides (the third and fourth sides 50C and 50D) is approximately 1.0 mm.

First Conductive Layer

As shown in FIG. 1 and FIG. 2, the first conductive layer 60 disposed on the main surface 52 of the substrate 50 includes a first mounting portion 62 on which the light emitting element 20 is mounted, and a second mounting portion 64 on which the integrated circuit 30 is mounted. The first mounting portion 62 includes a plurality of (for example, two) element-side conductive patterns 621 and 622, and the second mounting portion 64 includes a plurality of (for example, seven) circuit-side conductive patterns 641, 642, 643, 644, 645, 646 and 647. Moreover, the numbers and shapes of the conductive patterns in the mounting portions 62 and 64 are merely examples, and conductive patterns in different numbers and shapes may also be adopted.

In the example in FIG. 2, the first mounting portion 62 (the element-side conductive patterns 621 and 622) are disposed in a rectangular region having an area that is ⅕ or less of that of the main surface 52 of the substrate 50. In other words, the second mounting portion 64 (the circuit-side conductive patterns 641 to 647) are disposed in a rectangular region having an area that is ⅘ or more of that of the main surface 52. Thus, the area occupied by the second mounting portion 64 on the main surface 52 is larger than the area occupied by the first mounting portion 62. Therefore, the integrated circuit 30 having a larger chip size can be disposed.

First Mounting Portion of First Conductive Layer

The first mounting portion 62 is first described below. To better understand the description below, the element-side conductive patterns 621 and 622 are also respectively referred to as first and second element-side conductive patterns 621 and 622.

The first element-side conductive pattern 621 includes an element placement region 62A in which the light emitting element 20 is disposed. For example, when the light emitting element 20 is implemented by a VCSEL, a first electrode 24 is disposed at a position other than a plurality of light emitting regions 22 on a main surface (the upper surface in FIG. 2) of the light emitting element 20. Moreover, a second electrode (omitted from the drawing) is disposed on a back surface of the light emitting element 20 on an opposite side of the main surface of the light emitting element 20. For example, the first electrode 24 may be an anode electrode and the second electrode may be a cathode electrode. Light is emitted from the light emitting region 22 in a direction (the +Z direction, that is, the top) substantially perpendicular to the main surface of the light emitting element 20. The light is diffused inside the covering member 90 and is then emitted to outside from the light emitting surface 90T (referring to FIG. 1) of the photosensor 10.

The second electrode (the cathode electrode) of the light emitting element 20 is bonded to an element placement region 62A of the first element-side conductive pattern 621 by a conductive adhesive layer that is not shown in the drawing. Moreover, the first element-side conductive pattern 621 is connected to the second conductive layer 70 through the via conductor 821. Thus, the second electrode of the light emitting element 20 is electrically connected to the second conductive layer 70 through the first element-side conductive pattern 621 and the via conductor 821.

The second element-side conductive pattern 622 includes a wire bonding region 62B for bonding to a wire 101. One end of the wire 101 is bonded to the first electrode 24 (the anode electrode) of the light emitting element 20 and the other end is boned to the wire bonding region 62B. Moreover, the second element-side conductive pattern 622 is connected to the second conductive layer 70 through the via conductor 822. Thus, the first electrode 24 of the light emitting element 20 is electrically connected to the second conductive layer 70 through the second element-side conductive pattern 622 and the via conductor 822.

Second Mounting Portion of First Conductive Layer

Next, the second mounting portion 64 is described below. To better understand the description below, the circuit-side conductive patterns 641 to 647 are also respectively referred to as first to seventh circuit-side conductive patterns 641 to 647.

The first to seventh circuit-side conductive patterns 641 to 647 respectively include circuit placement regions 64A1, 64A2, 64A3, 64A4, 64A5, 64A6 and 64A7. The integrated circuit 30 is disposed in a rectangular placement region in which these circuit placement regions 64A1 to 64A7 are included, and is bonded to the first to seventh circuit-side conductive patterns 641 to 647 (circuit placement regions 64A1 to 64A7) through a conductive adhesive layer that is not shown in the drawing.

Moreover, the first to seventh circuit-side conductive patterns 641 to 647 are connected to the second conductive layer 70 through the via conductors 823 to 829, respectively. Thus, the integrated circuit 30 including the light receiving element 40 is electrically connected to the second conductive layer 70 through the first to seventh circuit-side conductive patterns 641 to 647 and the via conductors 823 to 829.

Moreover, the positions of the via conductors 823 to 829 formed at the first to seventh circuit-side conductive patterns 641 to 647 are not specifically defined, given that the first to seventh circuit-side conductive patterns 641 to 647 are individually connected to the second conductive layer 70. For example, any other desired elements and circuits can be mounted on the substrate of the integrated circuit 30 together with the light receiving element 40. Thus, the positions of the via conductors 823 to 829 can be determined only according to the mounting forms of the elements (including the light receiving element 40) and circuits on the substrate as well as the shapes and positions of a plurality of conductive patterns of the second conductive layer 70 described below.

Except for the seventh circuit-side conductive pattern 647, the first to sixth circuit-side conductive patterns 641 to 646 further include wire bonding regions 64B1, 64B2, 64B3, 64B4, 64B5 and 64B6, respectively. Conductive wires 111, 112, 113, 114, 115 and 116 are bonded on these wire bonding regions 64B1 to 64B6, respectively. Respective one ends of the wires 111 to 116 are bonded to pads 31, 32, 33, 34, 35 and 36 of the integrated circuit 30, and respective other ends are bonded to the wire bonding regions 64B1 to 64B6.

Wire Bonding Region of First Conductive Layer

As shown in FIG. 2, the wire bonding region 62B of the first mounting portion 62 is arranged near the first side 50A. Similarly, the wire bonding regions 64B1 to 64B6 of the second mounting portion 64 are arranged near the first side 50A. That is to say, all of the wire bonding regions 62B and 64B1 to 64B6 are arranged along one side of the substrate 50, and more particularly in the example in FIG. 2, arranged along the first side 50A that is a long side. In the above arrangement, because the wire bonding positions are centralized on one side of the substrate 50, layout efficiency can be achieved. Accordingly, extension directions of all the wires 111 to 116 substantially face toward an approximately same direction, and so wire bonding process can be easily performed with good precision.

Moreover, although omitted from the drawings, apart from the mounting regions for the light emitting element 20 and the integrated circuit 30 and the wire bonding regions 64B1 to 64B6, the first conductive layer 60 (the first and second mounting portions 62 and 64) is covered by an insulating layer 120. In the example in FIG. 2, an open portion 121 of the insulating layer 120 is represented by a single-dotted line at an opening of the mounting region for the integrated circuit 30. Moreover, the drawing of the insulating layer 120 is omitted from in FIG. 1.

Second Conductive Layer

As shown in FIG. 1 and FIG. 3, the second conductive layer 70 disposed on the back surface 54 of the substrate 50 includes a plurality of (for example, seven) conductive patterns 721, 722, 723, 724, 725, 726 and 727. Moreover, the numbers and shapes of the conductive patterns of the second conductive layer 70 are merely examples, and conductive patterns in different numbers and shapes may also be adopted.

Connection Relationship Between Wire Connecting Portion of Second Conductive Layer and First Conductive Layer The conductive pattern 721 is configured as a wire connecting portion that electrically connects the light emitting element 20 to the integrated circuit 30. The conductive pattern 721 is connected to the via conductors 821 and 823. Thus, the light emitting element 20 is connected to the pad 31 of the integrated circuit 30 through the first element-side conductive pattern 621 (the first mounting portion 62 of the first conductive layer 60), the via conductor 821 (the conductive via layer 80), the conductive pattern 721 (the second conductive layer 70), the via conductor 823 (the conductive via layer 80), the first circuit-side conductive pattern 641

(the second mounting portion 64 of the first conductive layer 60), and the wire 111. As a result, in the example in FIG. 3, when the integrated circuit 30 operates, the pad 31 is set to be at a potential of the second electrode (the cathode electrode) of the light emitting element 20.

Connection Relationship Between Terminal Portion of Second Conductive Layer and First Conductive Layer The conductive pattern 722 is configured as a terminal portion for the light emitting element 20. In the example in FIG. 3, the conductive pattern 722 is configured as a power supply terminal portion 722T to which a power supply voltage (for example, a power supply voltage for a VCSEL) needed for driving the light emitting element 20 is applied. The conductive pattern 722 is connected to the via conductor 822. Thus, the power supply voltage applied to the conductive pattern 722 is supplied to the first electrode 24 (the anode electrode) of the light emitting element 20 through the via conductor 822 (the conductive via layer 80), the second element-side conductive pattern 622 (the first mounting portion 62 of the first conductive layer 60) and the wire 101. The via conductor 822 is an example of the first via conductor.

The conductive patterns 723 to 727 are configured as terminal portions for the integrated circuit 30. Moreover, in FIG. 3, five terminal portions formed by the conductive patterns 723 to 727 are provided for the integrated circuit 30; however, the number of the terminal portions (that is, the number of conductive patterns) is not specifically defined, and may be appropriately modified according to the configuration of the integrated circuit 30. In addition, the type (function) of terminals allocated to the terminal portions (conductive patterns 723 to 727) is not specifically defined.

For example, the conductive pattern 723 is configured as a ground terminal portion 723T. Moreover, the ground terminal portion 723T of the conductive pattern 723 is configured as a terminal portion shared by the light emitting element 20 and the integrated circuit 30. The conductive pattern 723 is connected to the via conductor 824. Thus, a ground voltage applied to the conductive pattern 723 is supplied to the pad 32 of the integrated circuit 30 through the via conductor 824 (the conductive via layer 80), the second circuit-side conductive pattern 642 (the second mounting portion 64 of the first conductive layer 60) and the wire 112. As a result, in the example in FIG. 3, when the integrated circuit 30 operates, the pad 32 is set to be at a ground potential. The pad 32 is electrically connected to the pad 31 via an internal circuit (for example, a driving circuit for the light emitting element 20 below) of the integrated circuit 30.

The conductive pattern 724 is configured as a power supply terminal portion 724T to which a power supply voltage (for example, a voltage VDD lower than the power supply voltage for VCSEL) needed for driving the integrated circuit 30 is applied. The conductive pattern 724 is connected to the via conductor 825. Thus, the power supply voltage (the voltage VDD) applied to the conductive pattern 724 is supplied to the pad 33 of the integrated circuit 30 through the via conductor 825 (the conductive via layer 80), the third circuit-side conductive pattern 643 (the second mounting portion 64 of the first conductive layer 60) and the wire 113. As a result, in the example in FIG. 3, when the integrated circuit 30 operates, the pad 33 is set to be at a potential of the voltage VDD. The voltage VDD is also used as a power supply voltage for driving the light receiving element 40. The via conductor 825 is an example of the second via conductor.

The conductive patterns 725, 726 and 727 are configured as, for example, signal terminal portions 725T, 726T and 727T for the integrated circuit 30, respectively. For example, when the integrated circuit 30 is configured as a circuit compliant to an inter-integrated circuit ($I^2C$), the signal terminal portion 725T may be used as a serial clock (SCL) terminal, and the signal terminal portion 726T may be used as a serial data (SDA) terminal. Moreover, the signal terminal portion 727T may be used as a signal interrupt (INT) terminal.

In the example in FIG. 3, the conductive pattern 725 may include a wire connecting portion 725A connected to the via conductors 826 and 827. Thus, the conductive pattern 725 is electrically connected to the pad 34 of the integrated circuit 30 through the via conductor 826 (the conductive via layer 80), the fourth circuit-side conductive pattern 644 (the second mounting portion 64 of the first conductive layer 60) and the wire 114. As a result, a signal (for example, the serial clock) supplied to the conductive pattern 725 is supplied to the pad 34 of the integrated circuit 30. Moreover, the conductive pattern 725 is also electrically connected to the seventh circuit-side conductive pattern 647 through the via conductor 827 (the conductive via layer 80). Thus, the signal supplied to the conductive pattern 725 is also supplied to the seventh circuit-side conductive pattern 647.

The conductive pattern 726 is connected to the via conductor 828. Thus, the conductive pattern 726 is electrically connected to the pad 36 of the integrated circuit 30 through the via conductor 828 (the conductive via layer 80), the sixth circuit-side conductive pattern 646 (the second mounting portion 64 of the first conductive layer 60) and the wire 116. As a result, a signal (for example, the serial data) supplied to the conductive pattern 726 is supplied to the pad 36 of the integrated circuit 30. In this case, the conductive pattern 726 is also used as a serial data output terminal.

The conductive pattern 727 is connected to the via conductor 829. Thus, the conductive pattern 727 is electrically connected to the pad 35 of the integrated circuit 30 through the via conductor 829 (the conductive via layer 80), the fifth circuit-side conductive pattern 645 (the second mounting portion 64 of the first conductive layer 60) and the wire 115. As a result, a signal (for example, the interrupt signal supplied to the conductive pattern 727 is supplied to the pad 35 of the integrated circuit 30.

Moreover, the second conductive layer 70 is covered by an insulating layer 130 including opening portions 131 to 136 (indicated by single-dotted lines in FIG. 3). The conductive patterns 722 to 727 have the terminal portions 722T, 723T, 724T, 725T, 726T and 727T exposed from these opening portions 131 to 136, respectively. Moreover, the insulating layer 130 is omitted from in FIG. 1.

Groove of Covering Member

As shown in FIG. 1 and FIG. 2, in the plan view of the substrate 50, the covering member 90 includes a groove 92 between the light emitting element 20 and the integrated circuit 30. In the plan view, the groove 92 divides the main surface 52 of the substrate 50 into a first region in which the first mounting portion 62 is disposed and a second region in which the second mounting portion 64 is disposed. In the example in FIG. 1, the groove 92 is a slit that divides the covering member 90 into a first covering portion 90A and a second covering portion 90B. That is to say, the covering member 90 includes the first covering portion 90A covering the light emitting element 20, and the second covering portion 90B covering the integrated circuit 30, wherein the first covering portion 90A and the second covering portion 90B are separated from each other to define a slit as the groove 92 for exposing the substrate 50.

Thus, the groove 92 penetrates the covering member 90, the insulating layer 120 and the first conductive layer 60, and the first conductive layer 60 is physically cut into the first mounting portion 62 and the second mounting portion 64 by the groove 92. Hence, the first mounting portion 62 and the second mounting portion 64 are not electrically connected on the main surface 52 of the substrate 50. The groove 92 may have a width of 30 μm (micrometers) or more and 100 μm or less, for example, a micro slit having a width of 50 μm or so. Moreover, the groove 92 corresponds to a first groove.

By forming such groove 92, light from the light emitting element 20 and diffused toward the interface between the first covering portion 90A and the groove 92 (an air layer) is refracted at the interface and returns into the first covering portion 90A. Thus, light extraction efficiency of the light from the light emitting surface 90T of the photosensor 10 can be enhanced. Moreover, crosstalk caused by scattering light from the light emitting element 20 can be reduced.

Recess of Substrate

As shown in FIG. 1 and FIG. 2, the substrate 50 can include a recess 56 at a position corresponding to the groove 92 of the covering member 90. The recess 56 is formed as a slot having a predetermined depth (a minute depth) from the main surface 52 of the substrate 50. By forming such recess 56 at the substrate 50, the first conductive layer 60 can be more appropriately cut into the first mounting portion 62 and the second mounting portion 64. Moreover, if the first conductive layer 60 is cut into the first mounting portion 62 and the second mounting portion 64 by the groove 92 of the covering member 90, the recess 56 of the substrate 50 does not need to be formed.

The groove 92 of the covering member 90 and the recess 56 of the substrate 50 may be formed by, for example, while performing a singulation of a plurality of photosensor structural bodies (that is, a plurality of photosensors 10) formed on a large-size substrate, cutting each photosensor structural body to the position at which the recess 56 of the substrate 50 is to be formed.

Photosensor System

Figure 4:
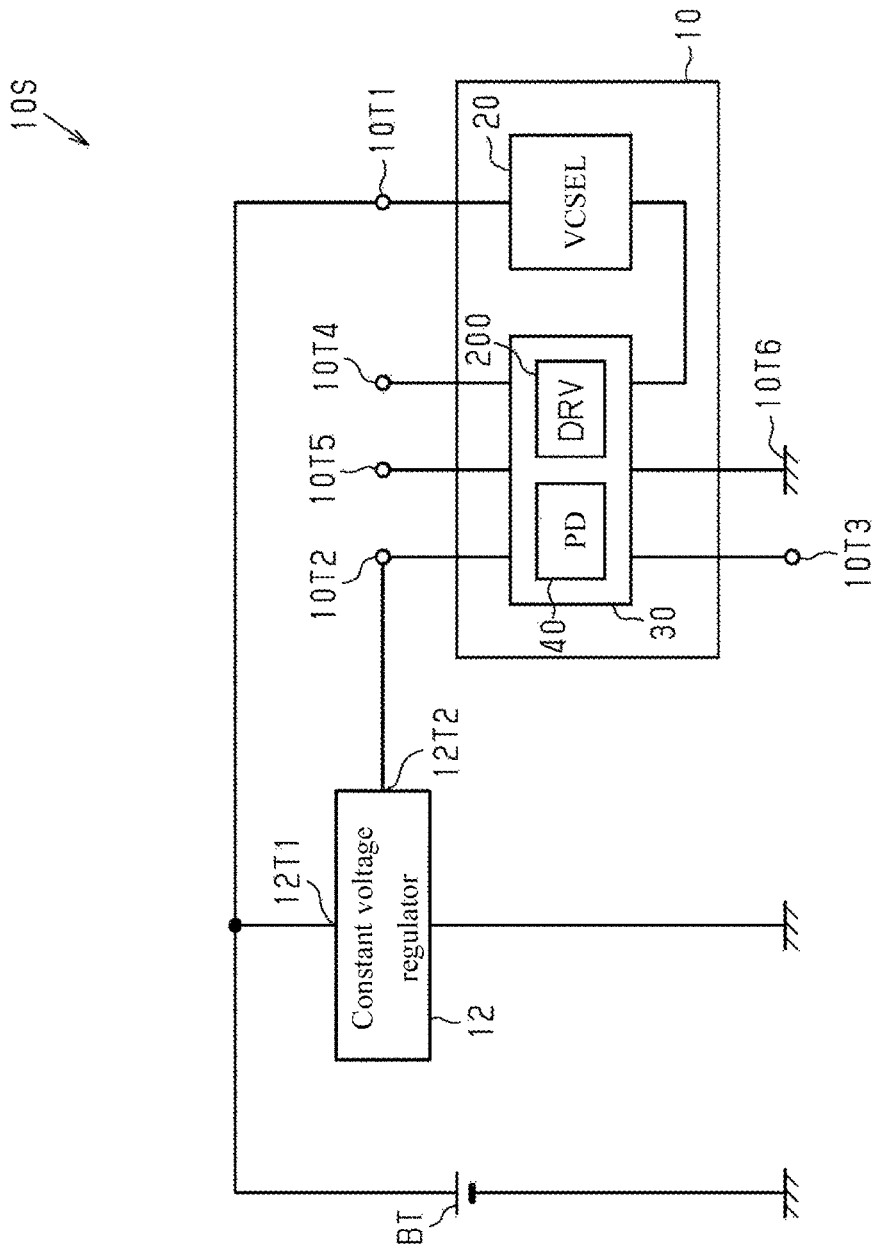
FIG. 4 is a brief circuit block diagram of a photosensor system including the photosensor in FIG. 1.

FIG. 4 shows a brief circuit block diagram of a photosensor system 10S including the photosensor 10.

The photosensor system 10S includes the photosensor 10 and a constant voltage regulator 12. The constant voltage regulator 12 is, for example, a low-dropout (LDO) regulator, and is connected to a battery BT serving as a power supply. The constant voltage regulator 12 includes a voltage input terminal 12T1 and a voltage output terminal 12T2, and steps down a first power supply voltage supplied from the battery BT to the voltage input terminal 12T1, and outputs the down-stepped voltage to the voltage input terminal 12T1. For example, the constant voltage regulator 12 steps down the first power supply voltage supplied by the battery BT to a second power supply voltage (a voltage VDD) suitable for driving the integrated circuit 30.

As described above, the photosensor 10 includes the light emitting element 20 (for example, a VCSEL) and the integrated circuit 30 including the light receiving element 40 (for example, a PD). As another example, the photosensor 10 includes a first power supply terminal 10T1, a second power supply terminal 10T2, first to third signal terminals 10T3, 10T4 and 10T5, and a ground terminal 10T6.

The first power supply terminal 10T1 may correspond to, for example, the power supply terminal portion 722T of the conductive pattern 722 in FIG. 3. The first power supply terminal 10T1 is connected to the voltage input terminal 12T1 of the constant voltage regulator 12 and the battery BT. The first power supply voltage (for example, a power supply voltage for the VCSEL) needed for driving the light emitting element 20 is supplied from the battery BT to the first power supply terminal 10T1. In other words, the light emitting element 20 is directly connected to the battery BT. The first power supply voltage supplied by the battery BT can, for example, fluctuate within a range between 2.7 V and 4.2 V according to the remaining capacity of the battery BT and operations of the photosensor system 10S.

The second power supply terminal 10T2 may correspond to, for example, the power supply terminal portion 724T of the conductive pattern 724 in FIG. 3. The second power supply terminal 10T2 is connected to the voltage output terminal 12T2 of the constant voltage regulator 12. Thus, a second power supply voltage (a voltage VDD) that the constant voltage regulator 12 generates for the integrated circuit 30 is supplied to the second power supply terminal 10T2. The voltage VDD may be, for example, 1.8 V.

The first to third signal terminals 10T3, 10T4 and 10T5 may correspond to the signal terminal portions 725T, 726T and 727T (for example, the serial clock terminal, the serial data terminal and the signal interrupt terminal) of the conductive patterns 725, 726 and 727 in FIG. 3, respectively. The ground terminal 10T6 may correspond to, for example, the ground terminal portion 723T of the conductive pattern 723 in FIG. 3.

Light Emitting Element Driving Circuit

As shown in FIG. 4, in the photosensor 10, the integrated circuit 30 may include a light emitting element driving circuit (denoted by "DRV" in FIG. 4) 200 for driving the light emitting element 20 as one internal circuit mounted in the integrated circuit 30.

Figure 5:
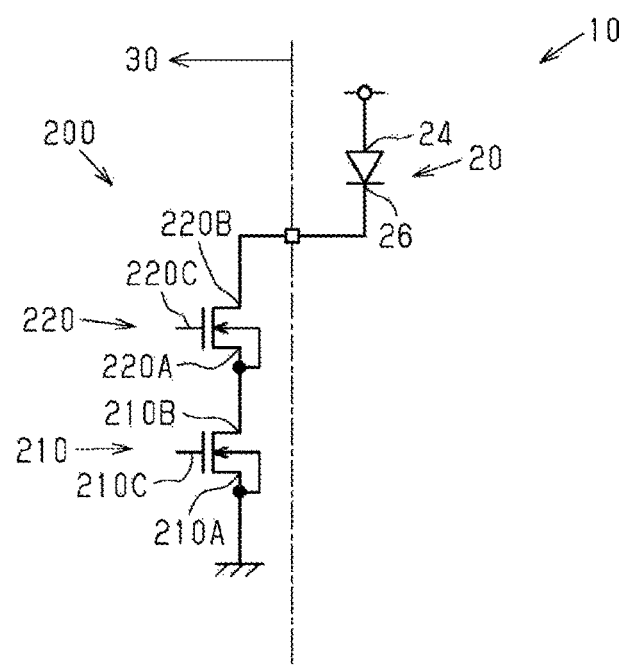
FIG. 5 is a brief circuit diagram of a light emitting element and a light emitting element driving circuit.

FIG. 5 shows a brief circuit diagram of the light emitting element 20 and the light emitting element driving circuit 200. The light emitting element driving circuit 200 includes a plurality of (for example, two) switch elements 210 and 220 connected in series. Each of the switch elements 210 and 220 may include, for example, an n-type metal-oxide-semiconductor field-effect transistor (MOSFET) serving as a low voltage resistant element.

For example, a first current terminal 210A (a source terminal in FIG. 5) of the switch element 210 is connected to a ground line. A second current terminal 210B (a drain terminal in FIG. 5) of the switch element 210 is connected to a first current terminal 220A (a source terminal in FIG. 5) of the switch element 220. A second current terminal 220B (a drain terminal in FIG. 5) of the switch element 220 is connected to a second electrode 26 (a cathode electrode in FIG. 5) of the light emitting element 20. The switch elements 210 and 220 are turned on and turned off via control signals supplied to control terminals 210C and 220C, and a current flows through the light emitting element 20 when both the switch elements 210 and 220 are turned on, hence emitting light from the light emitting element 20.

Although not shown in FIG. 3, the light emitting element driving circuit 200 may be, for example, mounted on the substrate of the integrated circuit 30 in FIG. 3. For example, the first current terminal 210A of the switch element 210 is connected to the pad 32 to which the ground potential is applied, and the second current terminal 220B of the switch element 220 is connected to the pad 31 to which the potential of the second electrode 26 (the cathode electrode, referring to FIG. 5) of the light emitting element 20 is applied. Thus, the light emitting element driving circuit 200 can be integrated in the integrated circuit 30. As a result, by mounting the light emitting element 20 on the first mounting portion 62, layout efficiency of the photosensor 10 can be achieved.

Moreover, in the light emitting element driving circuit 200 in FIG. 5, the two switch elements 210 and 220 connected in series function as voltage resistant elements. As described above, the light emitting element 20 is directly connected to the battery BT, and so the first power supply voltage from the battery BT is directly applied to the light emitting element 20 through the first power supply terminal 10T1 (referring to FIG. 4). At this point in time, the switch elements 210 and 220 are configured as voltage resistant elements so as to prevent the battery BT from supplying a voltage exceeding a withstand voltage (a maximum rated voltage) of the light emitting element 20. In other words, the switch elements 210 and 220 in a direct connection are set to be driving elements of the light emitting element 20 to suppress from applying a voltage exceeding the maximum rated voltage on the light emitting element 20.

Effects of Photosensor 10

The effects of the photosensor 10 are described below.

The photosensor 10 further includes the covering member 90, which is translucent and covers the light emitting element 20 and the integrated circuit 30 (the light receiving element 40). In the plan view of the substrate 50, the covering member 90 includes the groove 92 between the light emitting element 20 and the integrated circuit 30. With the groove 92, crosstalk caused by diffused light from the light emitting element 20 can be reduced, thereby inhibiting degraded detection accuracy of the light receiving element 40 with respect to an object.

Herein, the groove 92 is formed to physically cut the first conductive layer 60 into the first mounting portion 62 on which the light emitting element 20 is mounted, and the second mounting portion 64 on which the integrated circuit 30 is mounted. Hence, the first mounting portion 62 and the second mounting portion 64 are not electrically connected to each other on the main surface 52 of the substrate 50.

In response, the photosensor 10 includes the second conductive layer 70 disposed on a different layer position (for example, the back surface of the substrate 50) from the first conductive layer 60 (the first and second mounting portions 62 ad 64), and the first and second mounting portions 62 and 64 of the first conductive layer 60 are connected to the second conductive layer 70 through the conductive via layer 80.

For example, in FIG. 1 to FIG. 3, the light emitting element 20 is electrically connected to the pad 31 of the integrated circuit 30 through the first element-side conductive pattern 621 (the first mounting portion 62 of the first conductive layer 60), the via conductor 821 (the conductive via layer 80), the conductive pattern 721 (the second conductive layer 70), the via conductor 823 (the conductive via layer 80), the first circuit-side conductive pattern 641 (the second mounting portion 64 of the first conductive layer 60), and the wire 111. Thus, despite that the first mounting portion 62 and the second mounting portion 64 are physically cut on the main surface 52 of the substrate 50 by the groove 92, the first mounting portion 62 and the second mounting portion 64 can still be electrically connected to each other.

The photosensor 10 according to an embodiment provides the following advantages.

(1) The light emitting element 20 is electrically connected to the integrated circuit 30 through the first mounting portion 62 of the first conductive layer 60, the conductive via layer 80, the second conductive layer 70 and the second mounting portion 64 of the first conductive layer 60. Thus, despite that the first mounting portion 62 and the second mounting portion 64 are physically cut on the main surface 52 of the substrate 50 by the groove 92, the first mounting portion 62 and the second mounting portion 64 can still be electrically connected to each other through the conductive via layer 80 and the second conductive layer 70. As a result, the area of the conductive patterns disposed on the main surface 52 of the substrate 50 can be reduced, that is, the length of wires on the substrate 50 can be shortened, thereby increasing the size of the integrated circuit 30 mounted on the substrate 50. Moreover, because the first covering portion 90A covering the light emitting element 20 and the second covering portion 90B covering the integrated circuit 30 (the light receiving element 40) are separated from each other by the groove 92 (the air layer), crosstalk caused by scattering light from the light emitting element 20 can also be reduced.

(2) The integrated circuit 30 includes the light emitting element driving circuit 200 for driving the light emitting element 20. Thus, the light emitting element driving circuit 200 can be integrated in the integrated circuit 30. As a result, by mounting the light emitting element 20 on the first mounting portion 62, layout efficiency of the photosensor 10 can be achieved.

(3) The light emitting element driving circuit 200 includes the plurality of switch elements 210 and 220 connected in series between the second electrode 26 of the light emitting element 20 and the ground terminal. In the above configuration, the two switch elements 210 and 220 connected in series function as voltage resistant elements. Accordingly, the battery BT can be inhibited from applying a voltage that exceeds the maximum rated voltage to the light emitting element 20.

(4) The first mounting portion 62 is disposed in the first region (that is, a light emitting element-side region) of the substrate 50 defined by the groove 92, and the second mounting portion 64 is disposed in the second region (that is, an integrated circuit-side region) of the substrate 50 defined by the groove 92. The light emitting element 20 is connected to the first mounting portion 62 by the wire 101. Moreover, the integrated circuit 30 is connected to the second mounting portion 64 by the wires 111 to 116. In the above configuration, despite that the first mounting portion 62 and the second mounting portion 64 are physically cut by the groove 92, the first mounting portion 62 and the second mounting portion 64 can still be electrically connected to each other without crossing the wires 101 and 111 to 116 over the groove 92.

(5) The area of the first region (that is, the light emitting element-side region) of the substrate 50 is ⅕ or less of the area of the main surface 52 of the substrate 50, and the area of the second region (that is, the integrated circuit-side region) of the substrate 50 is ⅘ or less of the area of the main surface 52 of the substrate 50. In the above configuration, the area occupied by the second mounting portion 64 on the main surface 52 is larger than the area occupied by the first mounting portion 62. Therefore, the integrated circuit 30 having a larger chip size can be disposed.

(6) All of the wire bonding regions 62B and 64B1 to 64B6 are arranged along one side (the first side 50A that is a long side in the example in FIG. 2) of the substrate 50. In the above arrangement, because the wire bonding positions are centralized on one side of the substrate 50, layout efficiency can be achieved. Accordingly, extension directions of all the wires 111 to 116 substantially face toward an approximately same direction, and so wire bonding process can be easily performed with good precision.

(7) The first conductive layer 60 is disposed on the main surface 52 of the substrate 50, the second conductive layer 70 is disposed on the back surface 54 of the substrate 50, and the conductive via layer 80 penetrates the substrate 50. In the above configuration, because routing is performed is a manner of penetrating the substrate 50, the overall thickness of the photosensor 10 can be reduced.

(8) The substrate 50 includes the recess 56 at a position corresponding to the groove 92 of the covering member 90. In the above configuration, by forming the recess 56 at the substrate 50 while forming the groove 92 of the covering member 90, the first conductive layer 60 can be more appropriately cut into the first mounting portion 62 and the second mounting portion 64.

(9) The width of the groove 92 is 30 μm or more and 100 μm or less. Thus, the groove 92 can be made as a micro slit have a minute width.

(10) The light emitting element 20 is a vertical cavity surface emitting laser (VCSEL), and the light receiving element 40 is a photodiode (PD). By using a VCSEL having a higher directivity than a photodiode as the light emitting element 20, the photosensor 10 suitable as a reflective type photosensor can be implemented.

(11) As described above, the plurality of switch elements 210 and 220 (driving elements) of the light emitting element driving circuit 200 function as voltage resistant elements. Accordingly, the battery BT can be inhibited from applying a voltage that exceeds the maximum rated voltage to the light emitting element 20, such that the light emitting element 20 can be directly connected to the battery BT. For example, by an additionally provided boost circuit for stepping up the output voltage of the constant voltage regulator 12, a power supply voltage suitable for the light emitting element 20 can be supplied; however, such boost circuit is optional.

Variation Examples

The embodiments described above can be implemented according to the variations below. The embodiments described above and the variation examples below can be implemented in combination, given that they are not technically contradictory.

Figure 6:
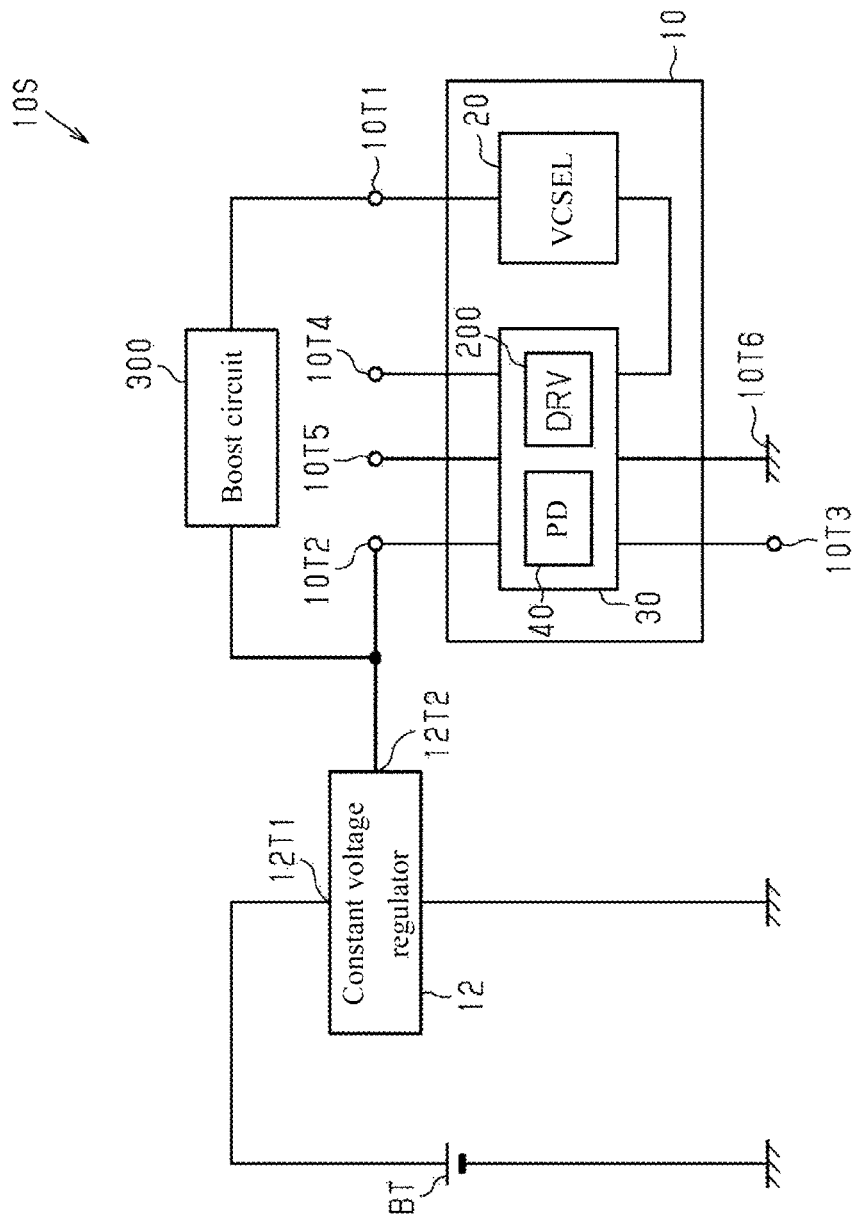
FIG. 6 is a brief circuit block diagram of another example of a photosensor system including a boost circuit.

The light emitting element 20 is not limited to being directly connected to the battery BT. As shown in FIG. 6, a boost circuit 300 may be connected to the voltage output terminal 12T2 of the constant voltage regulator 12. The boost circuit 300 steps up the output voltage (the voltage VDD for the integrated circuit 30) of the constant voltage regulator 12 to generate a power supply voltage suitable for the light emitting element 20 (that is, not exceeding the maximum rated voltage of the light emitting element 20). In this case, the light emitting element driving circuit 200 may include one single switch element.

The light emitting element 20 is not limited to being a VCSEL, and may be other semiconductor laser elements. Alternatively, the light emitting element 20 may be a light emitting diode.

The light receiving element 40 is not limited to being a photodiode, and may be a photo transistor.

The number of the light receiving element 40 is not limited to being two, and may be one or three or more.

In the plan view, the substrate 50 may also have a square shape.

The light emitting element driving circuit 200 may be mounted on the first mounting portion 62 instead of being included in the integrated circuit 30.

The first conductive layer is not limited to being the conductive layer 60 disposed on the main surface 52 of the substrate 50. Moreover, the second conductive layer is not limited to being the conductive layer 70 disposed on the back surface 54 of the substrate 50. In addition, the number of the conductive layers is not limited to being two. For example, in addition to the conductive layers 60 and 70, or in substitution for the conductive layers 60 and 70, a wire substrate is disposed on the substrate 50. The wire substrate includes two or more conductive layers, one or more inter-layer insulating layers disposed between adjacent conductive layers, and a via conductor (a conductive via layer) penetrating each inter-layer insulating layer. In this case, the light emitting element 20 and the integrated circuit 30 (the light receiving element 40) are mounted on the upper-most conductive layer of the wire substrate. Alternatively, the integrated circuit 30 may also be embedded in the wire substrate, given that the light receiving element 40 can receive light.

The term "on/over" used in the present disclosure includes meanings of "on/over" and "above", unless otherwise specified according to the context. Thus, the expression "a first element mounted on a second element" can refer to that the first element is in contact with the second element and directly disposed on the second element in one embodiment, or can refer to that the first element is not in contact with the second element and is configured over or above the second element in another embodiment. That is to say, the expression "on/over" does not eliminate a structure of another layer formed between the first element and the second element.

The Z-axis direction used in the present disclosure is not necessarily a vertical direction, and is not necessarily completely consistent with the vertical direction. Thus, regarding various structures (for example, the structure shown in FIG. 6) of the present disclosure, "up/top" and "down/bottom" of the Z-axis direction given in the description are not limited to be "up" and "down" of the vertical direction. For example, the X-axis direction can also be the vertical direction, or the Y-axis direction can also be the vertical direction.

The ordinal terms such as "first" and "second" used in the present disclosure are used to clearly differentiating constituting parts, and the constituting parts are not necessarily arranged in the given orders.

Notes

The technical concepts that are conceivable based on the embodiments and the variation examples are recoded in the description below. Moreover, the reference numerals or symbols of the constituting elements of the embodiment corresponding to the constituting elements described in the notes are marked with parentheses. The numerals or symbols are used for understanding purposes, and the constituting elements in the notes are not to be construed as constituting elements indicated by the numerals or symbols.

(Note A1)

A photosensor (10), comprising:
- a substrate (50);
- a first conductive layer (60), disposed on the substrate (50);
- a second conductive layer (70), disposed on a different layer position from the first conductive layer (60);
- a conductive via layer (80), disposed between the first conductive layer (60) and the second conductive layer (70);
- a light emitting element (20), mounted on the first conductive layer (60);
- an integrated circuit (30), mounted on the first conductive layer (60) and including a light receiving element (40); and
- a covering member (90) being translucent, disposed on the substrate (50), covering the light emitting element (20) and the integrated circuit (30) together with the first conductive layer (60), and including a groove (92) between the light emitting element (20) and the integrated circuit (30) in a plan view of the substrate (50), wherein
- the first conductive layer (60) includes:
- a first mounting portion (62), on which the light emitting element (20) is mounted; and
- a second mounting portion (64), on which the integrated circuit (30) is mounted, and
- the light emitting element (20) is electrically connected to the integrated circuit (30) through the first mounting portion (62), the conductive via layer (80), the second conductive layer (70) and the second mounting portion (64).

Note A2

The photosensor (10) according to Note A1, wherein the integrated circuit (30) includes a driving circuit (200) for the light emitting element (20).

Note A3

The photosensor (10) according to Note A2, wherein the light emitting element (20) includes:
- a first electrode (24), disposed on a main surface of the light emitting element (20); and
- a second electrode (26), disposed on a back surface of the light emitting element (20), wherein
- the second electrode (26) of the light emitting element (20) is electrically connected to the driving circuit (200) through the first mounting portion (62), the conductive via layer (80), the second conductive layer (70) and the second mounting portion (64).

Note A4

The photosensor (10) according to Note A3, wherein the driving circuit (200) includes a plurality of switching elements (210, 220) connected in series between the second electrode (26) of the light emitting element (20) and a ground terminal.

Note A5

The photosensor (10) according to any one of Notes A1 to A4, wherein the first mounting portion (62) and the second mounting portion (64) are physically cut by the groove (92), the first mounting portion (62) is arranged in a first region of the substrate (50) defined by the groove (92), the second mounting portion (64) is arranged in a second region of the substrate (50) defined by the groove (92), the light emitting element (20) is connected to the first mounting portion (62) by a first wire (101), and the integrated circuit (30) is connected to the second mounting portion (64) by a second wire (111 to 116).

Note A6

The photosensor (10) according to Note A5, wherein the second conductive layer (70) includes:
- a first conductive pattern (722), supplied with a first power supply voltage; and
- a second conductive pattern (724), supplied with a second power supply voltage less than the first power supply voltage,
- the first power supply voltage is supplied from the first conductive pattern (722) to the first mounting portion (62) through a first via conductor (822) disposed in the first region of the substrate (50), and
- the second power supply voltage is supplied from the second conductive pattern (724) to the second mounting portion (64) through a second via conductor (825) disposed in the second region of the substrate (50).

Note A7

The photosensor (10) according to Note A5 or A6, wherein the first region is less than 1/5 of an area of the main surface (52) of the substrate (50), and the second region is greater than 4/5 of the area of the main surface (52) of the substrate (50).

Note A8

The photosensor (10) according to Note A1 or A2, wherein the light emitting element (20) includes:
- a first electrode (24), disposed on a main surface of the light emitting element (20); and
- a second electrode (26), disposed on a back surface of the light emitting element (20), wherein
- the first mounting portion (62) includes:
- a first element-side conductive pattern (621), including an element placement region (62A) on which the second electrode (26) of the light emitting element (20) is mounted; and
- a second element-side conductive pattern (622), including a wire bonding region (62B) connected by a wire to the first electrode (24) of the light emitting element (20),
- the second mounting portion (64) includes a plurality of circuit-side conductive patterns (641 to 647) including a plurality of circuit placement regions (64A1 to 64A7) and a plurality of wire bonding regions (64B1 to 64B6),
- the integrated circuit (30) is mounted in a rectangular placement region including the plurality of circuit placement regions (64A1 to 64A7),
- the plurality of wire bonding regions (64B1 to 64B6) are connected to a plurality of pads (31 to 36) of the integrated circuit (30) by a plurality of wires (111 to 116), and the wire bonding region (62B) of the second element-side conductive pattern (622) and the plurality of wire bonding regions (64B1 to 64B6) of the plurality of circuit-side conductive patterns (641 to 647) are arranged along one side (50A) of the substrate (50).

Note A9

The photosensor (10) according to Note A8, wherein the substrate (50) has a rectangular shape in the plan view, and one side (50A) of the substrate (50) is a longer side of the substrate (50).

Note A10

The photosensor (10) according to any one of Notes A1 to A9, wherein the first conductive layer (60) is disposed on the main surface (52) of the substrate (50), the second conductive layer (70) is disposed on the back surface (54) of the substrate (50), and the conductive via layer (80) penetrates the substrate (50).

Note A11

The photosensor (10) according to any one of Notes A1 to A10, wherein the covering member (90) includes:
a first covering portion (90A), covering the light emitting element (20); and
a second covering portion (90B), covering the integrated circuit (30), and
the first covering portion (90A) and the second covering portion (90B) are separated from each other to define a slit as the groove (92) for exposing the substrate (50).

Note A12

The photosensor (10) according to Note A11, wherein the substrate (50) includes a recess (56) at a position corresponding to the slit (92) of the covering member (90).

Note A13

The photosensor (10) according to any one of Notes A1 to A12, wherein a width of the groove (92) of the covering member (90) is between 30 micrometers (μm) and 100 μm.

Note A14

The photosensor (10) according to any one of Notes A1 to A13, wherein the light emitting element (20) is a vertical cavity surface emitting laser, and the light receiving element (40) is a photodiode.

Note B1

A photosensor (10), comprising:
a substrate (50);
a light emitting element (20), disposed on the substrate (50), operating by a first power supply voltage supplied by a power supply (BT); and
the integrated circuit (30), disposed on the substrate (50), operating by a second power supply voltage lower than the first supply power voltage, and including the light receiving element (40).

Note C1

A photosensor system (10S), comprising
a photosensor (10), and
a constant voltage regulator (12),
wherein the constant voltage regulator (12) includes:
a voltage input terminal (12T1), receiving a first power supply voltage supplied by a power supply (BT); and
a voltage output terminal (12T2), outputting a second power supply voltage lower than the first power supply voltage; and
the photosensor (10) includes:
a first power supply terminal (10T1), connected to the power supply (BT) and the voltage input terminal (12T1) of the constant voltage regulator (12);
a light emitting element (20), operating by the first power supply voltage supplied to the first power supply terminal (10T1);
a second power supply terminal (10T2), connected to the voltage output terminal (12T2) of the constant voltage regulator (12); and
the integrated circuit (30), operating by the second power supply voltage supplied to the second power supply terminal (10T2), and including a light receiving element (40).

It should be noted that the description above is for illustrative and exemplary purposes. It can be understood by a person skilled in the art that, apart from the constituting elements and methods (manufacturing processes) enumerated in the technical details of the present disclosure, there are many other conceivable combinations and substitutions. The present disclosure is intended for encompassing all substitutions, modifications and variations covered by the scope of claims of the present disclosure.

The invention claimed is:
1. A photosensor, comprising:
a substrate;
a first conductive layer, disposed on a main surface of the substrate;
a second conductive layer, disposed on a back surface of the substrate;
a conductive via layer, disposed between the first conductive layer and the second conductive layer;
a light emitting element, mounted on the first conductive layer;
an integrated circuit (IC), mounted on the first conductive layer and including a light receiving element, wherein the IC includes a driving circuit for the light emitting element; and
a covering member being translucent, disposed on the substrate, covering the light emitting element and the IC together with the first conductive layer, and including a groove between the light emitting element and the IC in a plan view of the substrate, wherein
the first conductive layer includes:
a first mounting portion, on which the light emitting element is mounted; and
a second mounting portion, on which the IC is mounted, and
the light emitting element is electrically connected to the IC through the first mounting portion, the conductive via layer, the second conductive layer and the second mounting portion,
wherein the light emitting element includes:
a first electrode, disposed on a main surface of the light emitting element; and
a second electrode, disposed on a back surface of the light emitting element, wherein
the second electrode of the light emitting element is electrically connected to the driving circuit through the first mounting portion, the conductive via layer, the second conductive layer, and the second mounting portion.

2. The photosensor of claim 1, wherein the driving circuit includes a plurality of switching elements connected in series between the second electrode of the light emitting element and a ground terminal.

3. The photosensor of claim 1, wherein
the first mounting portion and the second mounting portion are physically cut by the groove,
the first mounting portion is arranged in a first region of the substrate defined by the groove,
the second mounting portion is arranged in a second region of the substrate defined by the groove,
the light emitting element is connected to the first mounting portion by a first wire, and
the IC is connected to the second mounting portion by a second wire.

4. The photosensor of claim 1, wherein
the first mounting portion and the second mounting portion are physically cut by the groove,
the first mounting portion is arranged in a first region of the substrate defined by the groove,
the second mounting portion is arranged in a second region of the substrate defined by the groove,
the light emitting element is connected to the first mounting portion by a first wire, and
the IC is connected to the second mounting portion by a second wire.

5. The photosensor of claim 2, wherein
the first mounting portion and the second mounting portion are physically cut by the groove,
the first mounting portion is arranged in a first region of the substrate defined by the groove,
the second mounting portion is arranged in a second region of the substrate defined by the groove,
the light emitting element is connected to the first mounting portion by a first wire, and
the IC is connected to the second mounting portion by a second wire.

6. The photosensor of claim 3, wherein
the second conductive layer includes:
a first conductive pattern, supplied with a first power supply voltage; and
a second conductive pattern, supplied with a second power supply voltage less than the first power supply voltage,
the first power supply voltage is supplied from the first conductive pattern to the first mounting portion through a first via conductor disposed in the first region of the substrate, and
the second power supply voltage is supplied from the second conductive pattern to the second mounting portion through a second via conductor disposed in the second region of the substrate.

7. The photosensor of claim 4, wherein
the second conductive layer includes:
a first conductive pattern, supplied with a first power supply voltage; and
a second conductive pattern, supplied with a second power supply voltage less than the first power supply voltage,
the first power supply voltage is supplied from the first conductive pattern to the first mounting portion through a first via conductor disposed in the first region of the substrate, and
the second power supply voltage is supplied from the second conductive pattern to the second mounting portion through a second via conductor disposed in the second region of the substrate.

8. The photosensor of claim 3, wherein
the first region is less than 1/5 of an area of the main surface of the substrate, and
the second region is greater than 4/5 of the area of the main surface of the substrate.

9. The photosensor of claim 6, wherein
the first region is less than 1/5 of an area of the main surface of the substrate, and
the second region is greater than 4/5 of the area of the main surface of the substrate.

10. The photosensor of claim 1, wherein
the first mounting portion includes:
a first element-side conductive pattern, including an element placement region on which the second electrode of the light emitting element is mounted; and
a second element-side conductive pattern, including a wire bonding region connected by a wire to the first electrode of the light emitting element,
the second mounting portion includes a plurality of circuit-side conductive patterns including a plurality of circuit placement regions and a plurality of wire bonding regions,
the IC is mounted in a rectangular placement region including the plurality of circuit placement regions,
the plurality of wire bonding regions are connected to a plurality of pads of the IC by a plurality of wires,
the wire bonding region of the second element-side conductive pattern and the plurality of wire bonding regions of the plurality of circuit-side conductive patterns are arranged along one side of the substrate.

11. The photosensor of claim 10, wherein the substrate has a rectangular shape in the plan view, and one side of the substrate is a longer side of the substrate.

12. A photosensor, comprising:
a substrate;
a first conductive layer, disposed on a main surface of the substrate;
a second conductive layer, disposed on a back surface of the substrate;
a conductive via layer, disposed between the first conductive layer and the second conductive layer;
a light emitting element, mounted on the first conductive layer;
an integrated circuit (IC), mounted on the first conductive layer and including a light receiving element; and
a covering member being translucent, disposed on the substrate, covering the light emitting element and the IC together with the first conductive layer, and including a groove between the light emitting element and the IC in a plan view of the substrate wherein
the first conductive layer includes:
a first mounting portion, on which the light emitting element is mounted; and
a second mounting portion, on which the IC is mounted, and
the light emitting element is electrically connected to the IC through the first mounting portion, the conductive via layer, the second conductive layer and the second mounting portion,
wherein the conductive via layer penetrates the substrate.

13. The photosensor of claim 1, wherein
the covering member includes:

a first covering portion, covering the light emitting element; and a second covering portion, covering the IC, and the first covering portion and the second covering portion are separated from each other to define a slit as the groove for exposing the substrate.

14. The photosensor of claim 13, wherein the substrate includes a recess at a position corresponding to the slit of the covering member.

15. The photosensor of claim 1, wherein a width of the groove of the covering member is between 30 micrometers (μm) and 100 μm.

16. A photosensor, comprising:

a substrate;

a first conductive layer, disposed on a main surface of the substrate;

a second conductive layer, disposed on a back surface of the substrate;

a conductive via layer, disposed between the first conductive layer and the second conductive layer;

a light emitting element, mounted on the first conductive layer;

an integrated circuit (IC), mounted on the first conductive layer and including a light receiving element; and a covering member being translucent, disposed on the substrate, covering the light emitting element and the IC together with the first conductive layer, and including a groove between the light emitting element and the IC in a plan view of the substrate, wherein the first conductive layer includes:

a first mounting portion, on which the light emitting element is mounted; and a second mounting portion, on which the IC is mounted, and the light emitting element is electrically connected to the IC through the first mounting portion, the conductive via layer, the second conductive layer and the second mounting portion, wherein the light emitting element is a vertical cavity surface emitting laser, and the light receiving element is a photodiode.

* * * * *